(12) United States Patent
Jitsuhara et al.

(10) Patent No.: US 7,880,817 B2
(45) Date of Patent: Feb. 1, 2011

(54) RECEIVER APPARATUS FOR OUTPUTTING DIGITAL VIDEO AND AUDIO SIGNALS AND RECEIVER SYSTEM INCORPORATING THE RECEIVER APPARATUS

(75) Inventors: Tsutomu Jitsuhara, Higashiosaka (JP); Miyoshi Yamauchi, Osaka (JP); Toyomi Yonemaru, Nabari (JP); Hitoshi Ogino, Toyonaka (JP); Akio Ito, Sakai (JP); Junichi Somei, Nara (JP); Akira Tokuda, Osaka (JP); Youichi Yuuki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1199 days.

(21) Appl. No.: 11/505,994

(22) Filed: Aug. 18, 2006

(65) Prior Publication Data

US 2007/0046831 A1 Mar. 1, 2007

(30) Foreign Application Priority Data

Aug. 24, 2005 (JP) ............................. 2005-242547

(51) Int. Cl.
*H04N 5/44* (2006.01)
*H04N 5/455* (2006.01)

(52) U.S. Cl. ..................... 348/725; 348/726; 348/731

(58) Field of Classification Search ......... 348/725–728, 348/731–733; 725/85, 100, 131, 139, 151; 455/300, 301; *H04N 5/44, 5/455, 5/50*
See application file for complete search history.

(56) References Cited

U.S. PATENT DOCUMENTS

| | | | |
|---|---|---|---|
| 5,955,988 A * | 9/1999 | Blonstein et al. ............ | 348/569 |
| 5,974,095 A | 10/1999 | Kitaura et al. | |
| 6,147,713 A | 11/2000 | Robbins et al. | |
| 6,400,419 B1 | 6/2002 | Yamamoto | |
| 6,501,510 B1 | 12/2002 | Moon | |
| 6,678,011 B2 | 1/2004 | Yanagi et al. | |
| 7,039,941 B1 | 5/2006 | Caporizzo et al. | |
| 7,164,449 B1 * | 1/2007 | White et al. ................. | 348/731 |
| 7,199,844 B2 | 4/2007 | Utsunomiya et al. | |
| 7,502,590 B2 * | 3/2009 | Suzu .......................... | 348/731 |

(Continued)

FOREIGN PATENT DOCUMENTS

CN 2520615 Y 11/2002

(Continued)

OTHER PUBLICATIONS

U.S. Appl. No. 11/634,197, filed Dec. 6, 2006, entitled "Receiver Apparatus and Receiver System".

(Continued)

*Primary Examiner*—Sherrie Hsia
(74) *Attorney, Agent, or Firm*—Nixon & Vanderhye P.C.

(57) ABSTRACT

A receiver apparatus 3 has a digital circuit portion 13 that converts a compressed digital signal outputted from a digital demodulating portion 12 into digital video and audio signals and a video/audio output circuit 14 that converts the digital video and audio signals outputted from the digital circuit portion 13 into analog video and audio signals. With this configuration, a video/audio processing IC for digital signal processing no longer needs to be mounted on the circuit board of a video display apparatus 4, and thus a receiver system can be realized with a video display apparatus having a simple configuration.

19 Claims, 3 Drawing Sheets

U.S. PATENT DOCUMENTS

| | | | |
|---|---|---|---|
| 7,692,726 | B1 | 4/2010 | Greenberg |
| 2002/0085126 | A1 | 7/2002 | Matsumoto et al. |
| 2005/0009481 | A1 | 1/2005 | Bushner |
| 2006/0026661 | A1 | 2/2006 | McMullin et al. |
| 2007/0058093 | A1 | 3/2007 | Azuma et al. |
| 2007/0103597 | A1* | 5/2007 | Shintani .................... 348/660 |
| 2007/0216806 | A1* | 9/2007 | Maehara .................... 348/565 |
| 2007/0216814 | A1 | 9/2007 | Azuma |

FOREIGN PATENT DOCUMENTS

| | | | |
|---|---|---|---|
| CN | 2622944 Y | 6/2004 |
| CN | 2658940 Y | 11/2004 |
| CN | 2694675 Y | 4/2005 |
| CN | 1683857 A | 10/2005 |
| JP | 54 011008 | 1/1979 |
| JP | 61-200781 A | 9/1986 |
| JP | 7-327176 A | 12/1995 |
| JP | 11-289272 A | 10/1999 |
| JP | 2000-68673 | 3/2000 |
| JP | 2001-320744 A | 11/2001 |
| JP | 2002-152063 | 5/2002 |
| JP | 2003-61009 A | 2/2003 |
| JP | 2003-189203 A | 7/2003 |
| JP | 3097065 U | 7/2003 |
| JP | 2005-039468 A | 2/2005 |
| JP | 3113691 U | 8/2005 |
| KR | 1993-0014560 A | 7/1993 |
| KR | 1997-0019629 A | 4/1997 |
| KR | 2003-0088188 A | 11/2003 |
| WO | 02-071747 A1 | 9/2002 |

OTHER PUBLICATIONS

U.S. Appl. No. 11/606,959, filed Dec. 1, 2006, entitled "Receiver Apparatus and Receiver System".

Partial English translation of the Japanese Notification of Grounds for Rejection mailed Jun. 10, 2008 in the Japanese application of co-pending U.S. Appl. No. 11/634,197.

Partial English translation of the Japanese Notification of Grounds for Rejection mailed Jun. 10, 2008 in the Japanese application of co-pending U.S. Appl. No. 11/606,959.

Partial English translation of the Japanese Notification of Grounds for Rejection mailed Jun. 10, 2008 in the Japanese application.

English translation of the Chinese Office action mailed Mar. 13, 2009 in corresponding Chinese applicatin 2006101669865.

U.S. Office Action mailed Aug. 18, 2010 in co-pending U.S. Appl. No. 11/593,508.

* cited by examiner

RECEIVER APPARATUS FOR OUTPUTTING DIGITAL VIDEO AND AUDIO SIGNALS AND RECEIVER SYSTEM INCORPORATING THE RECEIVER APPARATUS

This nonprovisional application claims priority under 35 U.S.C. §119(a) on Patent Application No. 2005-242547 filed in Japan on Aug. 24, 2005, the entire contents of which are hereby incorporated by reference.

BACKGROUND OF THE INVENTION

1. Field of the Invention

The present invention relates to a receiver apparatus and a receiver system for receiving a radio-frequency signal such as a digital television signal.

2. Description of Related Art

FIG. 3 is a block diagram showing an outline of the configuration of a conventional receiver system. The receiver system 900 shown in FIG. 3 is composed of: an antenna 901 for receiving a radio-frequency signal; a receiver apparatus 902 for performing predetermined processing on the signal received by the antenna 901 to acquire a desired signal; and a video display apparatus 903 for performing predetermined processing on the signal acquired by the receiver apparatus 902 to extract video and audio signals.

The receiver apparatus 902 is provided with: a tuner circuit portion 911 that converts the radio-frequency signal received by the antenna 901 into an intermediate-frequency signal; a digital demodulating portion 912 that converts the intermediate-frequency signal outputted from the tuner circuit portion 911 into a compressed digital signal; and a power supply portion 913 that feeds the tuner circuit portion 911 and the digital demodulating portion 912 with electric power from which they operate. The digital demodulating portion 912 is provided with a digital demodulating IC 914, which is a processing IC for converting the intermediate-frequency signal into a digital signal.

The video display apparatus 903 is provided with: a digital circuit portion 921 that converts the compressed digital signal fed from the receiver apparatus 902 into digital video and audio signals; a video/audio output circuit 922 that converts the digital video and audio signals outputted from the digital circuit portion 921 into analog video and audio signals; a display processing portion 923 that performs processing for displaying video based on the analog video signal outputted from the video/audio output circuit 922; an audio processing portion 924 that performs processing for outputting audio based on the analog audio signal outputted from the video/audio output circuit 922; and a power supply portion 925 that feeds the digital circuit portion 921, the video/audio output circuit 922, the display processing portion 923, and the audio processing portion 924 with electric power from which they operate. The digital circuit portion 921 is provided with: a video/audio processing IC 928 for extracting video and audio signals from the compressed digital signal; a video/audio processing memory 926 for temporarily storing data being processed during video/audio processing; and a program memory 927 for storing control codes for controlling the receiver apparatus.

In this conventional receiver system 900 configured as described above, the receiver apparatus 902 is electromagnetically shielded by being covered with a shield. On the other hand, the video display apparatus 903 has many functional blocks mounted on the circuit board thereof, namely the video/audio processing IC 928, the video/audio processing memory 926, the program memory 927, the video/audio output circuit 922, the display processing portion 923, and the audio processing portion 924. This requires an accordingly large number of components and conductors to be mounted and laid on the circuit board of the video display apparatus 903, which thus necessitates the use of a multiple-layer circuit board.

Moreover, the above-mentioned functional blocks mounted on the circuit board of the video display apparatus 903, namely the video/audio processing IC 928, the video/audio processing memory 926, the program memory 927, the video/audio output circuit 922, the display processing portion 923, and the audio processing portion 924, generate unnecessary electromagnetic emission and noise, against which measures need to be taken on the video display apparatus 903 as by providing it with an additional shield.

Furthermore, the above-mentioned functional blocks mounted on the circuit board of the video display apparatus 903, namely the video/audio processing IC 928, the video/audio processing memory 926, the program memory 927, the video/audio output circuit 922, the display processing portion 923, and the audio processing portion 924, also generate heat, against which measures need to be taken as by increasing the area of the circuit board or providing it with an additional heat-dissipating plate.

SUMMARY OF THE INVENTION

In view of the conventionally encountered inconveniences mentioned above, it is an object of the present invention to provide a receiver system provided with a video display apparatus having a simple configuration.

To achieve the above object, according to an aspect of the present invention, a receiver apparatus is provided with: a tuner circuit portion that converts a radio-frequency signal received by an antenna into an intermediate-frequency signal; a digital demodulating portion that converts the intermediate-frequency signal outputted from the tuner circuit portion into a compressed digital signal; a digital circuit portion that converts the compressed digital signal outputted from the digital demodulating portion into digital video and audio signals; and a video/audio output circuit that converts the digital video and audio signals outputted from the digital circuit portion into analog video and audio signals.

With the configuration according to the aspect of the present invention, a digital circuit portion and a video/audio output circuit, which are conventionally incorporated in a video display apparatus, are mounted on the circuit board of a receiver apparatus. This makes it possible to realize the video display apparatus with a single-layer circuit board instead of a multiple-layer circuit board. Also, a video processing IC no longer needs to be mounted on the circuit board of the video display apparatus, and thus no measures need to be taken against the heat dissipated from the IC. It is thus possible to realize a receiver system with a video display apparatus having a simple configuration.

DETAILED DESCRIPTION OF PREFERRED EMBODIMENTS

Figure 1:
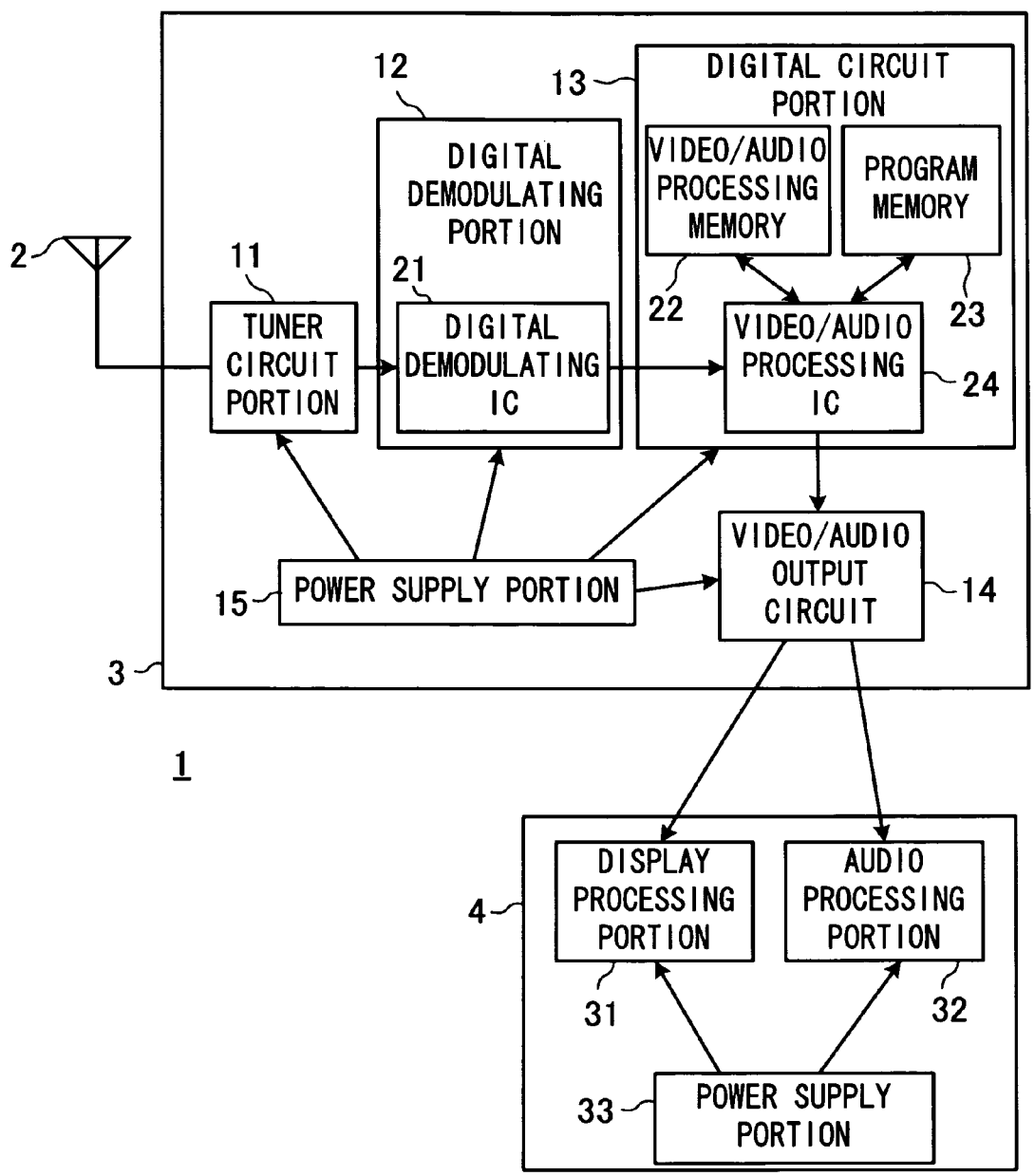
FIG. 1 is a block diagram showing an outline of the configuration of a receiver system according to an aspect of the present invention.

Hereinafter, the configuration of a receiver system according to various aspects of the present invention will be described with reference to the accompanying drawings. FIG. 1 is a block diagram showing an outline of the configuration of a receiver system according to an aspect of the present invention.

The receiver system 1 shown in FIG. 1 includes an antenna 2 for receiving a radio-frequency signal; a receiver apparatus 3 for performing predetermined processing on the signal received by the antenna 2 to acquire video and audio signals; and a video display apparatus 4 for displaying video based on the video signal fed from the receiver apparatus 3 and/or outputs audio based on the audio signal fed from the receiver apparatus 3.

The receiver apparatus 3 is provided with: a tuner circuit portion 11 that converts the radio-frequency signal received by the antenna 2 into an intermediate-frequency signal (hereinafter referred to as the "IF signal"); a digital demodulating portion 12 that converts the IF signal outputted from the tuner circuit portion 11 into a compressed digital signal; a digital circuit portion 13 that converts the compressed digital signal outputted from the digital demodulating portion 12 into digital video and audio signals; a video/audio output circuit 14 that converts the digital video and audio signals outputted from the digital circuit portion 13 into analog video and audio signals; and a power supply portion 15 that feeds the tuner circuit portion 11, the digital demodulating portion 12, the digital circuit portion 13, and the video/audio output circuit 14 with electric power from which they operate.

The digital demodulating portion 12 is provided with a digital demodulating IC 21, which is a processing IC for converting the IF signal into a digital signal. The digital circuit portion 13 is provided with: a video/audio processing IC 24 for extracting video and audio signals from the compressed digital signal; a video/audio processing memory 22 for storing the compressed digital video and audio signals and decoded digital video and audio signals; and a program memory 23 for storing control codes for controlling the receiver apparatus.

The video display apparatus 4 is provided with: a display processing portion 31 that performs processing for displaying video based on the analog video signal fed from the receiver apparatus 3; an audio processing portion 32 that performs processing for outputting audio based on the analog audio signal fed from the receiver apparatus 3; and a power supply portion 33 that feeds the display processing portion 31 and the audio processing portion 32 with electric power from which they operate.

Figure 2A:
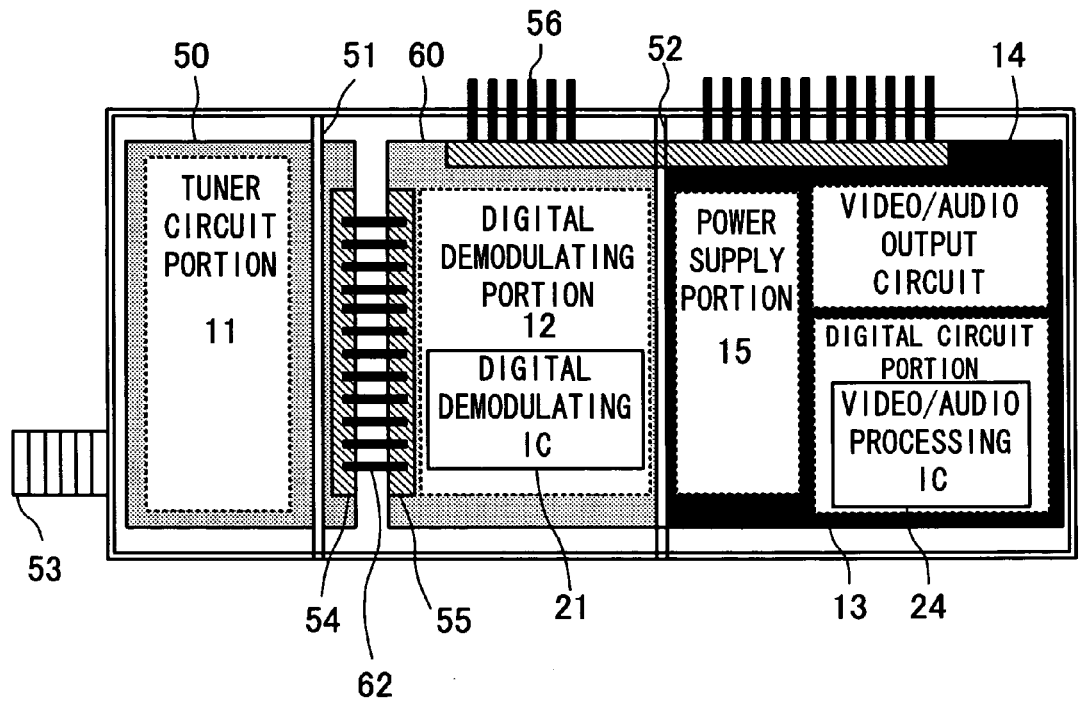
FIGS. 2A and 2B are diagrams schematically showing how functional blocks are mounted on the receiver apparatus 3 shown in FIG. 1.
Figure 2B:
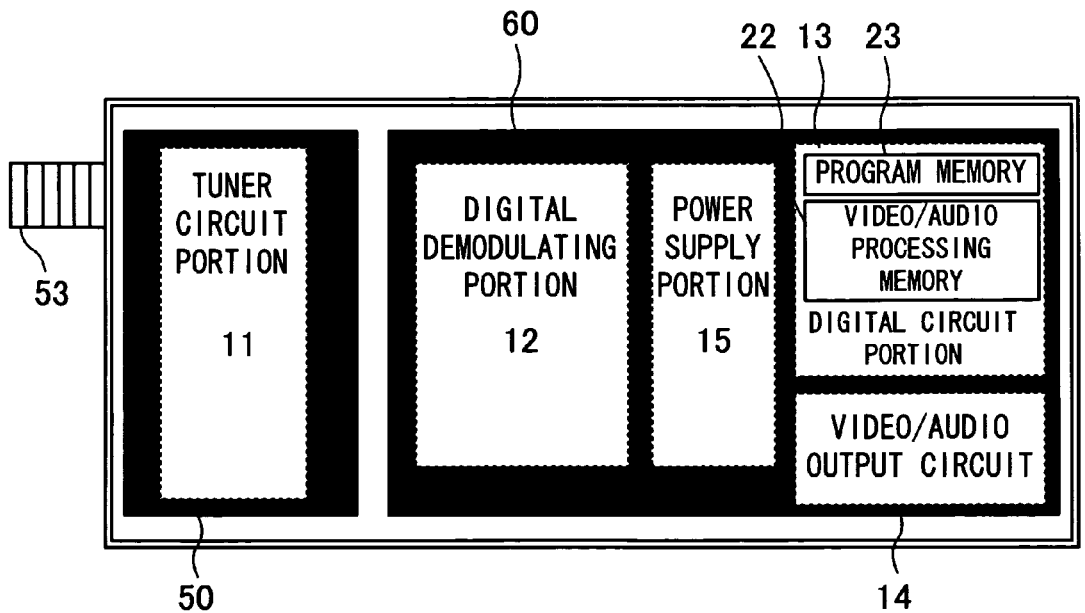
Figure 3:
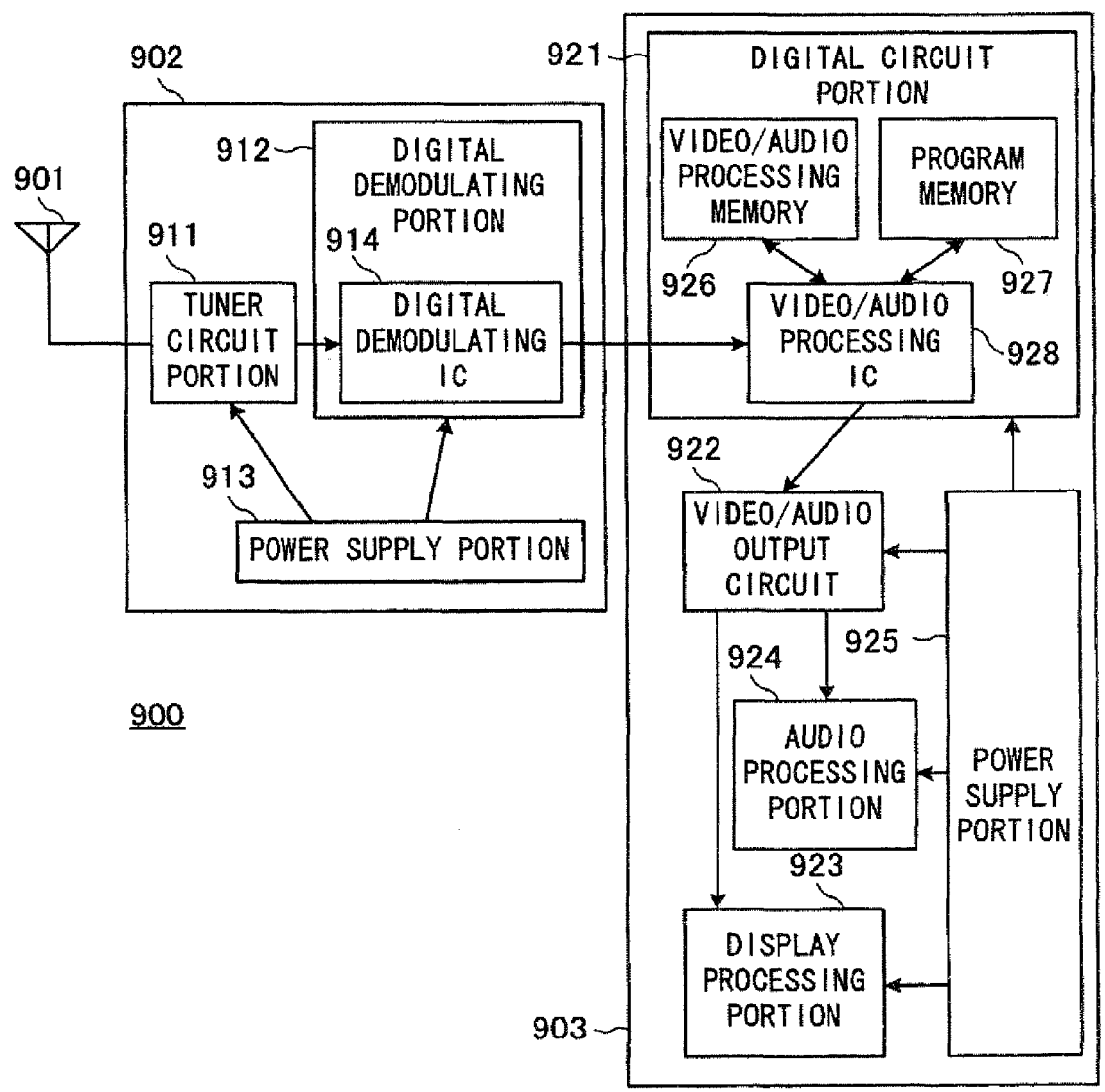
FIG. 3 is a block diagram showing an outline of the configuration of a conventional receiver system.

FIGS. 2A and 2B are diagrams schematically showing how functional blocks are mounted on the receiver apparatus 3 shown in FIG. 1, with FIG. 2A showing the receiver apparatus 3 as seen from one face (top face) thereof and FIG. 2B showing the receiver apparatus 3 as seen from the other face (bottom face) thereof.

As shown in FIG. 2A, the receiver apparatus 3 is composed of two circuit boards, namely a first circuit board 50 and a second circuit board 60. Between these circuit boards, a first shield plate 51 is inserted to electromagnetically shield them from each other.

Mounted on the first circuit board 50 is the tuner circuit portion 11. The first circuit board 50 is fitted on a chassis, and the analog ground pattern of the tuner circuit portion 11 is electrically connected to the chassis. The first circuit board 50 is provided with a tuner input terminal 53, via which the radio-frequency signal received by the antenna 2 is fed to the tuner circuit portion 11. The chassis has lids fitted thereto, one on the top face and another on the bottom face thereof, and thereby the first and second circuit boards 50 and 60 are each covered with a shield.

The first circuit board 50 is also provided with a first connector 54 along the edge thereof opposite to the edge at which the tuner input terminal 53 is provided. The second circuit board 60 is provided with a second connector 55 along the edge thereof facing the first circuit board 50. The first and second connectors 54 and 55 are electrically connected together with jumper wires 62.

Mounted on the second circuit board 60 are the digital demodulating portion 12, the digital circuit portion 13, the video/audio output circuit 14, and the power supply portion 15. As described above, the second circuit board 60 is electromagnetically shielded with the first shield plate 51 provided between it and the first circuit board 50.

The second circuit board 60 is provided with a third connector 56 along one edge thereof. The third connector 56 includes, in addition to the input/output terminals of the tuner circuit portion 11, the input/output terminals related to the functional blocks mounted on the second circuit board 60, namely the digital demodulating portion 12, the digital circuit portion 13, the video/audio output circuit 14, and the power supply portion 15. Within the third connector 56, near the first circuit board 50 is arranged the IF output terminal of the tuner circuit portion 11. Via this IF output terminal, the IF signal is outputted. Within the third connector 56, away from the first circuit board 50 are arranged the output terminal and the ground terminal of the video/audio output circuit 14.

The digital demodulating portion 12 and the digital circuit portion 13 are electromagnetically shielded from each other with a second shield plate 52. As the second circuit board 60, a multiple-layer circuit board is adopted so that the digital demodulating IC 21 provided in the digital demodulating portion 12 and the video/audio processing IC 24 provided in the digital circuit portion 13 are electrically connected together via an interlayer conductor pattern laid inside the second circuit board 60. These two ICs are mounted in positions apart from each other on the same face of the second circuit board 60. Moreover, the packages of the digital demodulating IC 21 and the video/audio processing IC 24 each make contact with the chassis via a thermally conductive member laid in between.

The digital circuit portion 13 has the video/audio processing IC 24 mounted on one face (top face) of the second circuit board 60, and has the video/audio processing memory 22 and the program memory 23 mounted on the other face (bottom face) of the second circuit board 60. The video/audio processing IC 24, the video/audio processing memory 22, and the program memory 23 are electrically connected together via the interlayer conductor pattern.

The power supply terminals of the tuner circuit portion 11, the digital demodulating portion 12, the digital circuit portion 13, and the video/audio output circuit 14 are arranged, within the third connector 56, between the output terminal of the video/audio output circuit 14 and the IF output terminal of the tuner circuit portion 11.

With this configuration, as the result of the digital circuit portion 13 and the video/audio output circuit 14 being mounted on the circuit board of the receiver apparatus 3, the video display apparatus 4 now needs to incorporate only the display processing portion 31 for displaying as video the video signal fed from the receiver apparatus 3 and the audio processing portion 32 for outputting as audio the audio signal fed from the receiver apparatus 3. This eliminates the need to adopt a multiple-layer circuit board. In the conventional configuration, since the digital circuit portion is provided in the video display apparatus, measures against the unnecessary electromagnetic emission and noise generated by the video/audio processing IC, the video/audio processing memory, the program memory, and the like need to be taken in the video display apparatus. By contrast, with the configuration according to the present invention, the digital circuit portion is provided in the receiver apparatus, and thus the video display apparatus can be configured without a digital circuit portion. This eliminates the need to take measures against unnecessary electromagnetic emission and noise in the video display apparatus.

The digital demodulating IC 21 and the video/audio processing IC 24 mounted on the circuit board of the receiver apparatus 3 are each connected to the chassis via a thermally conductive member laid in between. Thus, measures against the heat generated by the IC packages are taken. On the other hand, in the video display apparatus, which no longer needs to be provided with IC packages, no measures need to be taken against heat as by increasing the area of the circuit board or providing it with an additional heat-dissipating plate.

With the configuration according to the present invention, within the receiver apparatus, the first circuit board composed of analog circuits and the second circuit board composed of digital circuits are separated from each other. This prevents the digital noise generated by the digital demodulating portion and the digital circuit portion from entering the tuner circuit portion, and thus helps prevent degradation of the performance of the tuner circuit portion.

The analog ground pattern and the digital ground pattern are each electrically connected to the chassis. This eliminates the need to connect them, for ground connection, to the first connector provided on the first circuit board and the second connector provided on the second circuit board, and also helps reduce the impedance between the analog and digital grounds.

The third connector is provided along one edge of the second circuit board, and, via this connector, not only the input/output terminals of the tuner circuit portion 11, but also the input/output terminals related to the functional blocks mounted on the second circuit board, namely the digital demodulating portion 12, the digital circuit portion 13, the video/audio output circuit 14, and the power supply portion 15, are wired. This makes the design of the wiring in the video display apparatus easy.

Within the third connector 56, the IF output terminal of the tuner circuit portion 11 is arranged near the first circuit board, and, via this the IF output terminal, the IF signal is outputted. Within the third connector 56, the output terminal and the ground terminal of the video/audio output circuit 14 are arranged away from the first circuit board 50. Arranging the output terminal of the tuner circuit portion away from the output terminal of the video/audio output circuit in this way helps prevent the radio-frequency noise generated by the tuner circuit portion from entering the video/audio output circuit. Also, the digital noise generated by the digital demodulating portion and the digital circuit portion mounted on the second circuit board is prevented from mixing with the IF signal outputted from the tuner circuit portion.

The first and second circuit boards are separated from each other with a shield plate. This prevents the electromagnetic emission generated by the digital demodulating portion and the digital circuit portion mounted on the second circuit board from entering the tuner circuit portion on the first circuit board.

In addition, on the second circuit board, the digital demodulating portion and the digital circuit portion are separated from each other with a shield plate. This prevents the electromagnetic emission generated by the digital circuit portion from entering the digital demodulating portion.

On the second circuit board, the digital demodulating IC in the digital demodulating portion and the video/audio processing IC in the digital circuit portion are arranged in positions apart from each other on the same mount face. This permits the heat generated by the digital demodulating IC and the heat generated by the video/audio processing IC to spread out. In addition, the packages of these ICs each make contact with the chassis via a thermally conductive member laid in between. This permits the heat to be dissipated to the chassis and the lids, and thus helps alleviate the accumulation of the heat.

A receiver system according to the present invention can be suitably used as a receiver system for receiving a digital television broadcast or the like to display received video.

What is claimed is:

1. A receiver apparatus, comprising:
    a tuner circuit portion that converts a radio-frequency signal received by an antenna into an intermediate-frequency signal;
    a digital demodulating portion that converts the intermediate-frequency signal outputted from the tuner circuit portion into a compressed digital signal;
    a digital circuit portion that converts the compressed digital signal outputted from the digital demodulating portion into digital video and audio signals;
    a video/audio output circuit that converts the digital video and audio signals outputted from the digital circuit portion into analog video and audio signals;
    a first circuit board on which the tuner circuit portion is arranged; and
    a second circuit board on which the digital circuit portion, the digital demodulating portion, and the video/audio output circuit are arranged,
    wherein the digital circuit portion includes:
        a video/audio processing IC that decodes compressed digital video and audio signals; and
        a video/audio processing memory that stores the compressed digital video and audio signals and decoded digital video and audio signals, and
    on the second circuit board, the video/audio processing memory is arranged on a face opposite to the tuner circuit portion mounted on the first circuit board, and is arranged on a face opposite to the video/audio processing IC.

2. The receiver apparatus of claim 1, further comprising a connecting portion that connects together conductor patterns between the first and second circuit boards.

3. The receiver apparatus of claim 2, wherein the connecting portion is composed of jumper wires.

4. The receiver apparatus of claim 1, wherein the first and second circuit boards are housed inside the chassis, and an analog ground conductor pattern of the first circuit board and a digital ground conductor pattern of the second circuit board are electrically connected to the chassis.

5. The receiver apparatus of claim 4, wherein the digital demodulating portion includes a digital demodulating IC, which is a processing IC for converting the intermediate-frequency signal into a digital signal, and on the second circuit board, the digital demodulating IC and the video/audio processing IC are arranged in positions apart from each other on a same mount face.

6. The receiver apparatus of claim 5, wherein
on the second circuit board, the digital demodulating IC and the video/audio processing IC each make contact with the chassis via a thermally conductive member laid in between.

7. The receiver apparatus of claim 1, wherein
the digital demodulating portion includes a digital demodulating IC, which is a processing IC for converting the intermediate-frequency signal into a digital signal, and
on the second circuit board, the digital demodulating IC and the video/audio processing IC are arranged in positions apart from each other on a same mount face.

8. The receiver apparatus of claim 7, wherein
on the second circuit board, the digital demodulating IC and the video/audio processing IC each make contact with the chassis via a thermally conductive member laid in between.

9. The receiver apparatus of claim 7, wherein
the second circuit board is a multiple-layer circuit board, and the video/audio processing IC and the video/audio processing memory are wired together via an interlayer conductor pattern.

10. The receiver apparatus of claim 1, wherein
the second circuit board is a multiple-layer circuit board, and the video/audio processing IC and the video/audio processing memory are wired together via an interlayer conductor pattern.

11. The receiver apparatus of claim 1, wherein
on the second circuit board, input/output terminals of the tuner circuit portion, the digital demodulating portion, the digital circuit portion, and the video/audio output circuit are arranged in a concentrated fashion along one edge of the second circuit board.

12. The receiver apparatus of claim 11, wherein
on the second circuit board, an output terminal and a ground terminal of the video/audio output circuit are arranged in a position opposite to the first circuit board.

13. The receiver apparatus of claim 12, wherein
on the second circuit board, an IF output terminal for outputting the intermediate-frequency signal obtained through conversion by the tuner circuit portion is arranged in a position near the first circuit board.

14. The receiver apparatus of claim 13, wherein
a power supply portion is provided that feeds electric power to each of the tuner circuit portion, the digital demodulating portion, the digital circuit portion, and the video/audio output circuit, and
on the second circuit board, power supply terminals for feeding electric power to the tuner circuit portion, the digital demodulating portion, the digital circuit portion, and the video/audio output circuit are arranged between the output terminal of the video/audio output circuit and the IF output terminal.

15. The receiver apparatus of claim 11, wherein
on the second circuit board, an IF output terminal for outputting the intermediate-frequency signal obtained through conversion by the tuner circuit portion is arranged in a position near the first circuit board.

16. The receiver apparatus of claim 15, wherein
a power supply portion is provided that feeds electric power to each of the tuner circuit portion, the digital demodulating portion, the digital circuit portion, and the video/audio output circuit, and
on the second circuit board, power supply terminals for feeding electric power to the tuner circuit portion, the digital demodulating portion, the digital circuit portion, and the video/audio output circuit are arranged between the output terminal of the video/audio output circuit and the IF output terminal.

17. The receiver apparatus of claim 1, wherein
the first and second circuit boards are separated from each other with a first shield plate.

18. The receiver apparatus of claim 17, wherein
on the second circuit board, the digital demodulating portion and the digital circuit portion are separated from each other with a second shield plate.

19. A receiver system comprising:
the receiver apparatus of claim 1; and
a video display apparatus that displays video based on a video signal outputted from the receiver apparatus and/or outputs audio based on an audio signal outputted from the receiver apparatus,
wherein the receiver system receives digital and analog broadcast signals, extracts video and audio signals therefrom, and displays video and/or outputs audio according thereto.

* * * * *